United States Patent
Jacobsson

(10) Patent No.: US 9,668,336 B1
(45) Date of Patent: May 30, 2017

(54) INLAY PCB WITH EMBEDDED COIN BOARD

(71) Applicant: Flextronics AP, LLC, Broomfield, CO (US)

(72) Inventor: Henrik Jacobsson, Kullavik (SE)

(73) Assignee: Flextronics AP, LLC, Broomfield, CO (US)

( * ) Notice: Subject to any disclaimer, the term of this patent is extended or adjusted under 35 U.S.C. 154(b) by 379 days.

(21) Appl. No.: 13/897,253

(22) Filed: May 17, 2013

Related U.S. Application Data

(60) Provisional application No. 61/649,126, filed on May 18, 2012.

(51) Int. Cl.
| | | |
|---|---|---|
| H05K 1/11 | (2006.01) | |
| H05K 1/02 | (2006.01) | |
| H05K 1/03 | (2006.01) | |
| H05K 3/00 | (2006.01) | |

(52) U.S. Cl.
CPC ............ *H05K 1/0212* (2013.01); *H05K 1/03* (2013.01); *H05K 3/00* (2013.01)

(58) Field of Classification Search
CPC ........... H05K 1/0212; H05K 1/03; H05K 3/00
USPC ........ 174/265, 250–252, 255–259, 261–262, 174/264
See application file for complete search history.

(56) References Cited

U.S. PATENT DOCUMENTS

| | | | |
|---|---|---|---|
| 4,069,497 A | 1/1978 | Steidlitz | |
| 4,338,149 A | 7/1982 | Quaschner | |
| 4,712,160 A | 12/1987 | Sato et al. | |
| 4,899,256 A | 2/1990 | Sway-Tin | |
| 5,101,322 A | 3/1992 | Ghaem et al. | |
| 5,116,440 A | 5/1992 | Takeguchi | |
| 5,121,297 A | 6/1992 | Haas | |
| 5,175,047 A | 12/1992 | McKenney | |
| 5,206,463 A | 4/1993 | DeMaso | |
| 5,235,491 A | 8/1993 | Weiss | |
| 5,272,599 A | 12/1993 | Koenen | |
| 5,295,044 A | 3/1994 | Araki et al. | |
| 5,365,403 A | 11/1994 | Vinciarelli et al. | |
| 5,536,677 A | 7/1996 | Hutbacher | |
| 5,838,554 A | 11/1998 | Lanni | |
| 5,872,051 A | 2/1999 | Fallon et al. | |
| 5,873,512 A | 2/1999 | Bielick et al. | |
| 5,920,458 A | 7/1999 | Azar | |
| 5,933,324 A | 8/1999 | Barrett | |
| 6,189,771 B1 | 2/2001 | Maeda et al. | |
| 6,243,269 B1 | 6/2001 | Dibene, II et al. | |
| 6,245,595 B1 | 6/2001 | Nguyen | |
| 6,272,015 B1 | 8/2001 | Mangtani | |
| 6,282,092 B1 | 8/2001 | Okamoto et al. | |
| 6,311,139 B1 | 10/2001 | Kuroda et al. | |
| 6,369,328 B1 | 4/2002 | Munakata | |

(Continued)

*Primary Examiner* — Tremesha S Willis

(74) *Attorney, Agent, or Firm* — Haverstock & Owens LLP

(57) ABSTRACT

A PCB and a method of manufacturing a PCB with combined inlay-PCB process and embedded coin technology are disclosed. The method and device disclosed herein is able to manufacture an inlay part of a high frequency laminate into FR4 laminate. The present invention is advantageous in many aspects including having an inlay design on the PCB, which can save the cost of high frequency laminate. Further, the inlay PCB with embedded coin technologies can enhance the thermal reliability of the finished PCB.

18 Claims, 4 Drawing Sheets

(56) References Cited

U.S. PATENT DOCUMENTS

| | | |
|---|---|---|
| 6,549,409 B1 | 4/2003 | Saxelby et al. |
| 6,775,162 B2 | 8/2004 | Mihai et al. |
| 6,795,315 B1 | 9/2004 | Wu et al. |
| 7,208,833 B2 | 4/2007 | Nobori et al. |
| 7,676,775 B2 | 3/2010 | Chen et al. |
| 8,707,221 B2 | 4/2014 | Durkan |
| 2001/0003427 A1 | 6/2001 | Ferguson et al. |
| 2001/0018263 A1 | 8/2001 | Ochiai et al. |
| 2002/0008963 A1 | 1/2002 | DiBene, II et al. |
| 2002/0092160 A1 | 7/2002 | McCullough |
| 2004/0101624 A1* | 5/2004 | Bayes ............... 427/337 |
| 2004/0122606 A1 | 6/2004 | Cohen et al. |
| 2004/0144527 A1 | 7/2004 | Yang et al. |
| 2005/0246590 A1 | 11/2005 | Lancaster |
| 2006/0196642 A1 | 9/2006 | Gharib |
| 2007/0176613 A1* | 8/2007 | Ogawa ............ G02B 6/138 361/760 |
| 2007/0198548 A1 | 8/2007 | Lee |
| 2007/0272435 A1* | 11/2007 | Johnson ........... H05K 1/0204 174/259 |
| 2007/0273011 A1 | 11/2007 | Singleton et al. |
| 2008/0217768 A1 | 9/2008 | Miranda et al. |
| 2008/0224026 A1 | 9/2008 | Pasternak |
| 2008/0301597 A1 | 12/2008 | Chen et al. |
| 2009/0014501 A1 | 1/2009 | Nishi et al. |
| 2009/0265155 A1 | 10/2009 | Yokogawa |
| 2011/0307752 A1 | 12/2011 | Fuji et al. |
| 2012/0104591 A1* | 5/2012 | Warren ............ H01L 23/4334 257/712 |
| 2013/0256850 A1* | 10/2013 | Danny et al. ............ 257/664 |
| 2015/0376444 A1 | 12/2015 | Saito |

* cited by examiner

INLAY PCB WITH EMBEDDED COIN BOARD

CROSS-REFERENCE TO RELATED APPLICATION(S)

This application claims priority under 35 U.S.C. §119(e) of the U.S. Provisional Patent Application Ser. No. 61/649,126, filed May 18, 2012 and titled "INLAY PCB WITH EMBEDDED COIN SAMPLE BOARD EVALUATION STUDY," which is hereby incorporated by reference in its entirety for all purposes.

FIELD OF THE INVENTION

The present invention relates to the field of manufacturing printed circuit boards (PCBs). More specifically, the present invention relates to the field of manufacturing PCBs with enhanced thermal properties and increased reliability.

BACKGROUND OF THE INVENTION

In a typical PCB, a full panel of FR4 material is in hybrid with a full panel of high frequency material, such as Rogers RO4000® series high-frequency circuit materials and Taconic PTFE laminates. However, only a small portion of the PCB is designed for high frequency signal transfer, the unused portion of the high frequency material being wastes, unnecessarily increases manufacturing costs of the PCB. With increasing demand for high frequency products, there is a need to manufacture these products more efficiently and at reduced costs.

SUMMARY OF THE INVENTION

A PCB and a method of manufacturing a PCB with a combined inlay-PCB process and embedded coin technology are disclosed. The method allows the fabrication of an inlay part of high frequency laminate into an FR4 laminate. Advantageously, the inlay part is included on the PCB, a structure that reduces the cost of the high frequency laminate. Further, the inlay PCB with embedded coin technologies can enhance the thermal reliability of the finished PCB board.

In one aspect, an electronic circuit board comprises a printed circuit board having a first aperture and a second aperture, a high-frequency circuit material coupled to the first aperture, and a heat dissipating material coupled to the second aperture.

In some embodiments, the heat dissipating material comprises a coin. In one embodiment, the coin comprises copper. In some other embodiments, the high frequency material is fabricated/structured/configured to transfer a signal having a frequency of 500 MHz and above. In some embodiments, the high frequency circuit material is fabricated/structured/configured to transfer a microwave frequency signal. In other embodiments, the second aperture is deeper than the first aperture in the printed circuit board. In some other embodiments, the printed circuit board comprises an FR4 printed circuit board.

In another aspect, a method of making an electronic circuit board comprises forming a first aperture on an electronic circuit board, forming a second aperture on the electronic circuit board, placing a high-frequency circuit material in the first aperture, and placing a heat dissipating material in the second aperture.

In some embodiments, the method further comprises transferring a high-frequency signal on an area of the electronic circuit board. In other embodiments, the high-frequency signal has a microwave signal. In some other embodiments, the high-frequency signal has a frequency of 500 MHz and above. In some embodiments, the electronic circuit board comprises an FR4 PCB. In other embodiments, the heat dissipating material comprises a coin. In one embodiment, the coin comprises a copper coin.

In another aspect, a method of forming an inlay PCB board with an embedded coin comprises forming a high-frequency opening through first layers of a PCB, forming an opening for a coin through second layers of the PCB, performing oxide replacement, inserting a high-frequency laminate into the opening of the first layers of the PCB, and inserting a coin into the opening of the second layers of the PCB.

In some other embodiments, forming the high frequency opening and opening for the coin comprise routing. In other embodiments, the high-frequency opening has a size less than 2.5 mil per side larger than the high-frequency laminate. In some other embodiments, the opening for a coin has a size less than 5.5 mil per side larger than a size of the coin. In some embodiments, the first layers comprise fewer than 5 layers of laminates of the PCB. In other embodiments, the second layers comprise more than 7 layers of laminates of the PCB.

Other features and advantages of the present invention will become apparent after reviewing the detailed description of the embodiments set forth below.

BRIEF DESCRIPTION OF THE DRAWINGS

The embodiments are described by way of examples, with reference to the accompanying drawings, which are meant to be exemplary and not limiting. For all figures described herein, like numbered elements refer to like elements throughout.

DETAILED DESCRIPTION OF THE PREFERRED EMBODIMENT

Reference is made in detail to the embodiments of an inlay PCB with embedded coin manufacturing method and apparatus of the invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details.

Figure 1A:
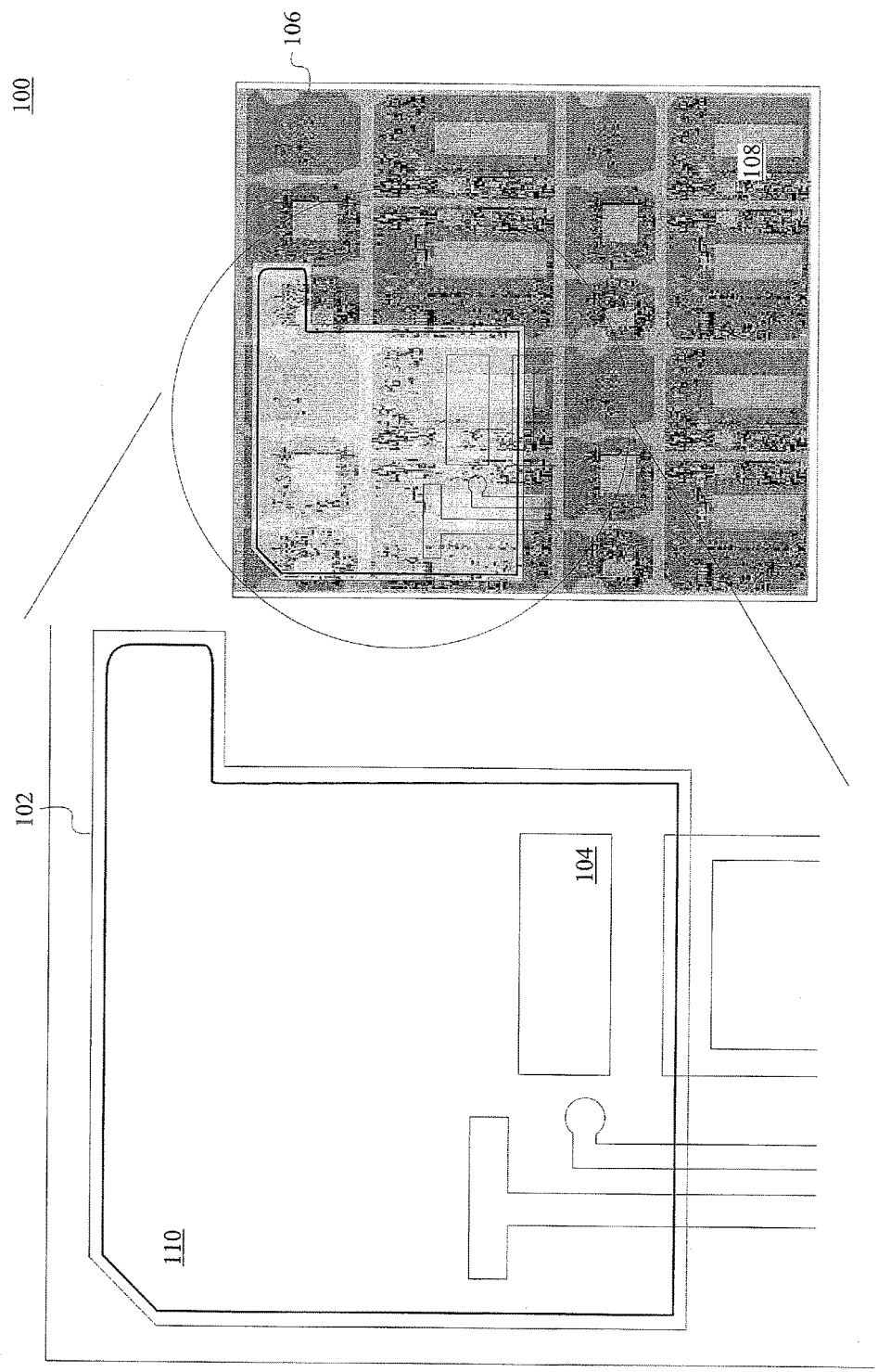
FIG. 1A is a top view of a circuit board with an inlay PCB with an embedded coin in accordance with some embodiments of the present invention.
Figure 1B:
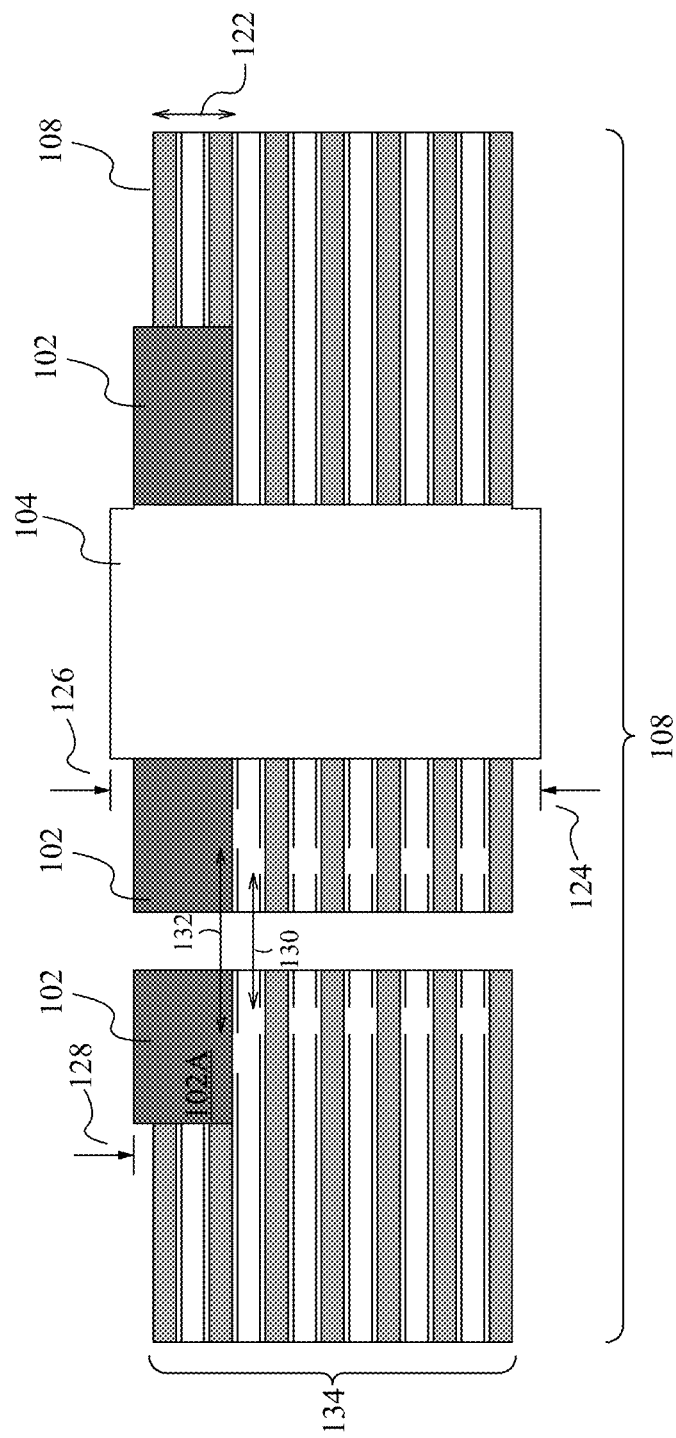
FIG. 1B is a side cross-sectional view of the circuit board of FIG. 1A.

FIG. 1A is a top view illustrating a circuit board 100 with an inlay PCB with an embedded coin in accordance with some embodiments of the present invention. FIG. 1B is a side cross-sectional view of the circuit board 100.

Referring to both FIGS. 1A and 1B, in some embodiments, the circuit board 100 contains a PCB board 106 having an inlay part 102 and an FR4 part 108. FR4 is a composite material of woven fiberglass cloth with an epoxy resin binder. FR4 is described herein as an exemplary material. Other materials, such as G-10, G-11, and FR5, can be used to manufacture the laminate of the PCB board are within the scope of the present invention. The inlay part 102 can contain a high frequency portion 110 for high frequency signal transfer. In some embodiments, the inlay part 102 contains an embedded coin part 104. In some embodiments, the embedded coin part 104 contains a coin. In some embodiments, the FR4 part 104 has between 2-4 layers. Examples of the FR4 part include EMC, EM 370, high glass transition temperature (High-Tg) FR4 materials, and HF FR4. In some embodiments, the inlay part 102 has an inlay capture size 132 having a predetermined drilling size of +20 mil and an inner layer capture size 130 having a predetermined drilling size of +10 mil. The inlay protrusion 128 can be +/−1 mil. The coin depression 126 can be +/−0.02 microns. The coin protrusion 124 can be 0-0.04 microns.

Figure 2:
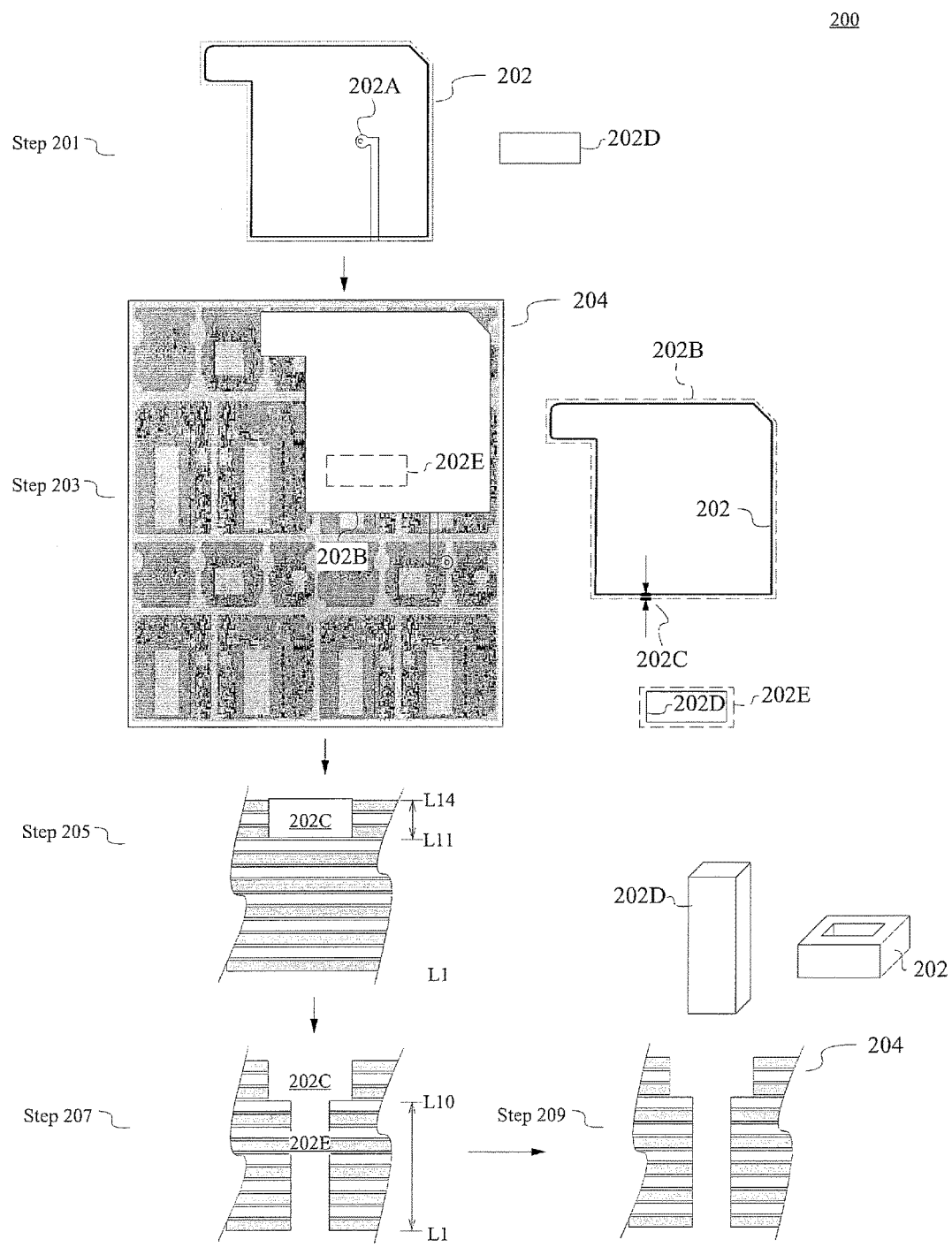
FIG. 2 illustrates a method of manufacturing a circuit board having an inlay PCB with an embedded coin in accordance with some embodiments of the present invention.

FIG. 2 illustrates a method of manufacturing a board 200 having an inlay PCB with an embedded coin. At Step 201, the dimensions of a high frequency laminate 202 and a coin 202D are measured. In some embodiments, the high frequency laminate 202 comprises RO4350B. A person of ordinary skill in the art will appreciate that any high frequency laminate, such as a laminate for transferring signals in microwave frequency, is able to be used within the scope of the present invention. In some embodiments, the coin 202D is a metal coin, such as a copper coin. A person of ordinary skill in the art will appreciate that other coins of any material can be used so long as they are able to facilitate heat dissipation of the board 200. The high frequency laminate 202 comprises an electric circuit 202A. In some embodiments, the layers L1-L14 (layer 1 to layer 14) are first fixed together by bonding and riveting.

At Step 203, an embedded space 202B to fit the high frequency laminate 202 is determined and is routed out. In some embodiments, the size 202C of the embedded space 202B is 1-2 mil per side larger than the size of the high frequency laminate 202. In some embodiments, the size of the embedded space 202B is controlled to be in a range that is sufficient to fit the high frequency laminate 202 and not so large that it requires a lot of resin to fill in a gap between the high frequency laminate 202 and a hosting FR4 PCB board 204. After the location of the embedded space 202B is determined, the location is outlined by routing. In some embodiments, the location of the embedded space 202B is outlined first. The size of the outlined embedded space 202B is compared with a measured size of the high frequency laminate 202. If after the comparison it is determined that the location of the embedded space 202B is not within the pre-determined limits, adjusted routing is performed. This procedure is able to keep the size difference between the embedded space 202B and the high frequency laminate 202 within 2-3 mils. The size matching, between the embedded space 202B and the high frequency laminate 202, enhances an alignment accuracy of the high frequency laminate 202 on the board 200.

At Step 205, the embedded space 202B for fitting the high frequency laminate 202 is routed out by forming an embedded window 202C. The embedded window 202C has a surface area and geometry shown as the embedded space 202B. The height of the embedded window 202C extends from layer L14 to layer L10 or L 11 of the laminates of the board 200.

At Step 207, a coin window 202E is routed out. Similar to the process of opening windows for the high frequency laminate 202, a coin space (coin window 202E) has a pre-determined equal to the size of the coin 202D, plus 4.5 mil per side. The depth of the coin window 202E extends from the layer L1 to the layer L 10. In some embodiments, a space for pre-preg (e.g., pre-impregnating an epoxy material) is opened, with a size equal to the coin size plus 6 mil per side or a size of the high frequency laminate 202 plus 6 mil per side.

At Step 209, both the coin 202D and the high frequency laminate 202, such as RO4350B, are inserted into the opening of the FR4 PCB board 204 in a lay-up table. Because there are no guiding holes for the coin 202D and the high frequency laminate 202 to align on the board 204, this method of controlling the opening size and location, such as by pre-measuring the actual size of the coin 202D and the high frequency laminate 202 to dynamically adjust the hole/window opening size and location, provides better alignments of the above components. In some embodiments, the accuracy of the alignment is controlled within 3 mil shift of a pre-determined location.

Figure 3:
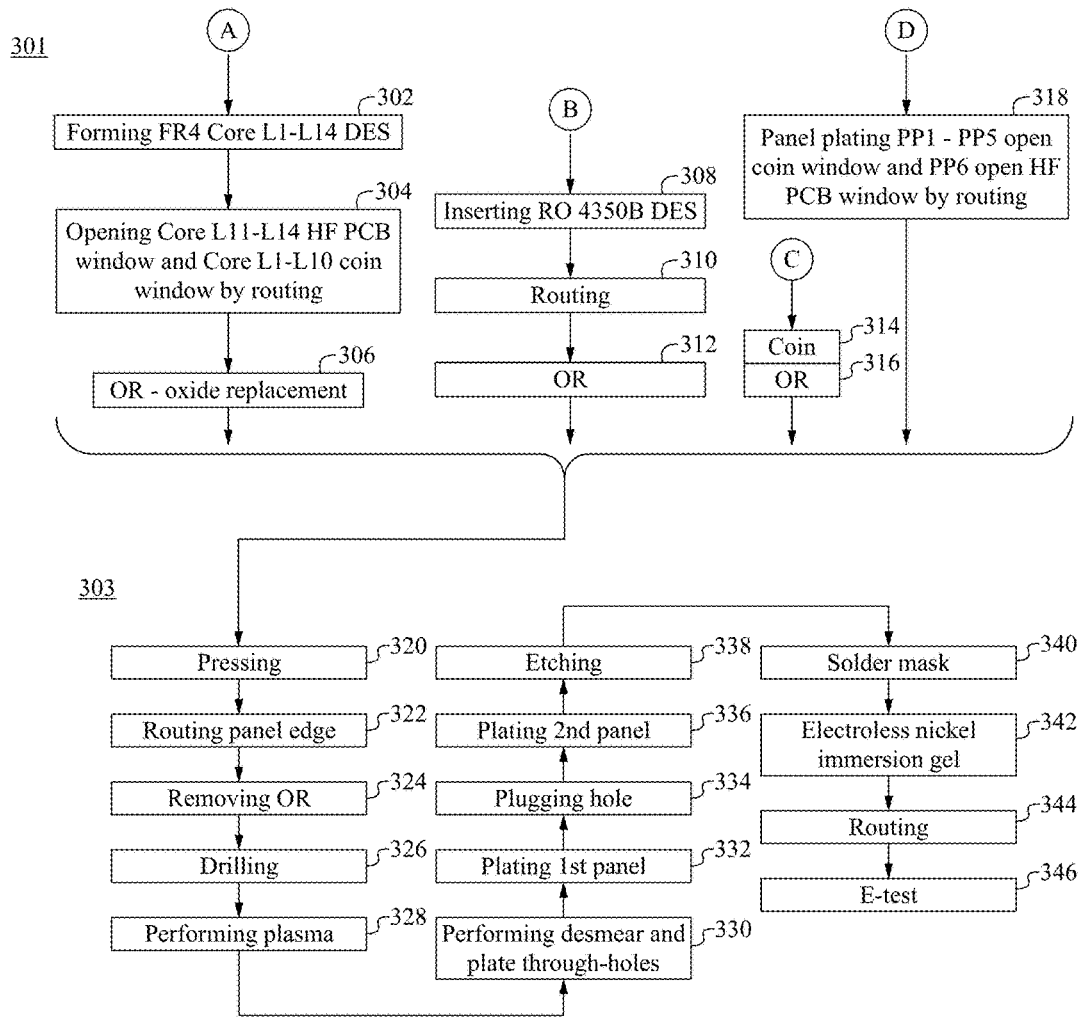
FIG. 3 illustrates a process of manufacturing a PCB board in accordance with some embodiments of the present invention.

FIG. 3 illustrates a process 300 in accordance with some embodiments of the present invention. The process 300 comprises a part 301 and a part 303. In some embodiments, the part 301 comprises procedure groups A, B, C and D. Group A comprises steps 302, 304, and 306. Group B comprises steps 308, 310, and 312. Group C comprises steps 314 and 316. Group D comprises step 318. In some embodiments, after the steps of a group are performed, the steps included in the part 303 are performed. For example, the procedure in Group A is performed first. Next, the steps of part 303 are performed. Next, the steps of Group B are performed, followed by the steps of part 303. The steps of Group A include preparing FR4 core L1-L14 laminate in the step 302, opening HF PCB (high frequency printed-circuit board) window and coin window by routing in the step 304, and performing oxide replacement (OR) in the step 306. The steps of Group B comprise inserting a high frequency laminate, such as RO 4350B, in the step 308, performing routing in the step 310, and performing oxide replacement in the step 312. Group C comprises inserting a coin in the step 314 and performing oxide replacement in the step 316. Group D comprises panel plating the open coin window and panel plating the HF PCB window.

The part 303 comprises the steps of pressing in a step 320, routing panel edge in a step 322, performing oxide replacement in a step 324, drilling in a step 326, performing plasma etching in a step 328, performing desmear and plating through-holes in a step 330, plating a $1^{st}$ panel in a step 332, performing hole plugging in a step 334, plating a $2^{nd}$ panel in a step 336, etching in a step 338, performing solder mask in a step 340, performing an electroless nickel immersion gold (ENIG) process in a step 342, routing in a step 344, and testing in a step 346. A person of ordinary skill in the art appreciates that any other surface finishing process are able to be used at the step 342. In the present specification, 14 layers of the laminates are used as an example. Any other numbers of layers of the laminates are within the scope of the present invention, such as from 4 layers to 30 layers. The size (depth/area) of the openings for the high frequency laminate and the coin can be proportional to the numbers of the layers of the FR4 laminates. RO 4350B and EM 370 are used as exemplary embodiments. Other high frequency laminates and FR4 laminates are able to be used as a material for inlay and are all with the scope of the present invention.

The methods and devices disclosed herein can be utilized to manufacture inlay PCB with embedded coin.

In operation, the high frequency part, such as RO4350B, is first routed out and its actual size is measured. Next, an opening on the PCB board (FR4 PCB) is routed out per the size of the high frequency part by changing routing compensation such that the size differences between the opening and the actual size of the high frequency part are within 2-3 mil. Through these methods, windows for both the high frequency part and the coin are opened. Next, the high frequency part and the coin are inserted into the windows.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiments chosen for illustration without departing from the spirit and scope of the invention as defined by the appended claims.

What is claimed is:

1. An electronic circuit board comprising:
   a. a printed circuit board comprising a PCB portion and a high frequency portion for high frequency signal transfer, wherein the high frequency portion includes a first aperture and a second aperture that is in direct contact with the first aperture;
   b. a high-frequency circuit material coupled to the first aperture; and
   c. a heat dissipating material coupled to the second aperture, wherein the heat dissipating material comprises an inserted metallic coin, wherein the inserted metallic coin is in a direct contact with the high-frequency circuit material to facilitate a heat dissipation of the high-frequency circuit.

2. The electronic circuit board of claim 1, wherein the inserted metallic coin comprises copper.

3. The electronic circuit board of claim 1, wherein the high-frequency circuit material is fabricated to transfer a signal having a frequency of 500 MHz and above.

4. The electronic circuit board of claim 1, wherein the high-frequency circuit material is fabricated to transfer a microwave frequency signal.

5. The electronic circuit board of claim 1, wherein the second aperture is deeper than the first aperture in the printed circuit board.

6. The electronic circuit board of claim 1, wherein the printed circuit board comprises an FR4 printed circuit board.

7. A method of making an electronic circuit board comprising:
   a. forming a first aperture on a high frequency portion for high frequency signal transfer on an electronic circuit board;
   b. forming a second aperture on the high frequency portion on the electronic circuit board, wherein the first aperture is in direct contact with the second aperture;
   c. placing a high-frequency circuit material in the first aperture; and
   d. placing a heat dissipating material in the second aperture, wherein the heat dissipating material comprises an inserted metallic coin and wherein the inserted metallic coin is in a direct thermal contact with the high-frequency circuit material to facilitate a heat dissipation of the high-frequency circuit material.

8. The method of claim 7, further comprising transferring a high-frequency signal on an area of the electronic circuit board.

9. The method of claim 8, wherein the high-frequency signal comprises a microwave signal.

10. The method of claim 8, wherein the high-frequency signal has a frequency of 500 MHz and above.

11. The method of claim 7, wherein the electronic circuit board comprises an FR4 PCB.

12. The method of claim 7, wherein the inserted metallic coin comprises a copper coin.

13. A method of forming an inlay PCB with an embedded coin comprising:
   a. forming a high-frequency opening on a high frequency portion, through a first set of plurality of layers, of a PCB board, wherein the PCB board comprises a PCB portion and the high frequency portion;
   b. forming an opening for a coin on the high frequency portion, through a second set of plurality of layers, of the PCB board, wherein the opening for the coin is in direct contact with the high-frequency opening;
   c. performing oxide replacement;
   d. inserting a high-frequency laminate into the opening of the first set of plurality of layers of the PCB board; and
   e. inserting the coin into the opening of the second set of plurality of layers of the PCB board such that the coin is in direct thermal contact with the high-frequency laminate to facilitate a heat dissipation of the high-frequency laminate.

14. The method of claim 13, wherein forming the high-frequency opening and the opening for the coin comprise routing.

15. The method of claim 13, wherein the high-frequency opening has a length less than 2.5 mil per side larger than a size of the high-frequency laminate.

16. The method of claim 13, wherein the opening for the coin has a length less than 5.5 mil per side larger than a size of the coin.

17. The method of claim 13, wherein the first set of plurality of layers comprise fewer than 5 layers of laminates of the PCB board.

18. The method of claim 13, wherein the second set of plurality of layers comprise more than 7 layers of laminates of the PCB board.

* * * * *